(12) United States Patent
Choi et al.

(10) Patent No.: US 9,958,744 B2
(45) Date of Patent: May 1, 2018

(54) DISPLAY PANEL AND DISPLAY DEVICE INCLUDING THE SAME

(71) Applicant: ELECTRONICS AND TELECOMMUNICATIONS RESEARCH INSTITUTE, Daejeon (KR)

(72) Inventors: Jihun Choi, Daejeon (KR); Jae-Eun Pi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days. days.

(21) Appl. No.: 15/356,058

(22) Filed: Nov. 18, 2016

(65) Prior Publication Data
US 2017/0176804 A1 Jun. 22, 2017

(30) Foreign Application Priority Data

Dec. 18, 2015 (KR) .................. 10-2015-0181839
Jun. 29, 2016 (KR) .................. 10-2016-0081975

(51) Int. Cl.
H01L 31/00 (2006.01)
G02F 1/1345 (2006.01)
H01L 27/12 (2006.01)
H01L 23/00 (2006.01)

(52) U.S. Cl.
CPC .......... *G02F 1/13458* (2013.01); *H01L 24/05* (2013.01); *H01L 24/06* (2013.01); *H01L 24/16* (2013.01); *H01L 24/17* (2013.01); *H01L 27/124* (2013.01); *H01L 2224/0401* (2013.01); *H01L 2224/05025* (2013.01); *H01L 2224/06102* (2013.01); *H01L 2224/16227* (2013.01); *H01L 2224/1703* (2013.01)

(58) Field of Classification Search
None
See application file for complete search history.

(56) References Cited

U.S. PATENT DOCUMENTS

| 7,777,857 | B2 | 8/2010 | So |
| 9,040,990 | B2 | 5/2015 | Jo et al. |
| 9,110,347 | B2 | 8/2015 | Suh et al. |
| 2007/0120152 | A1* | 5/2007 | Chang .............. G02F 1/133345 257/270 |
| 2012/0051083 | A1 | 3/2012 | Park et al. |

FOREIGN PATENT DOCUMENTS

| JP | 2001-265244 A | 9/2001 |
| KR | 10-1147990 B1 | 5/2012 |
| KR | 10-2013-0074558 A | 7/2013 |

* cited by examiner

*Primary Examiner* — Reema Patel

(57) ABSTRACT

Provided is display panel including a substrate including a pixel area and a pad area; and a first conductive line and a second conductive line stacked on the substrate, wherein the first conductive line includes a first part disposed on the pixel area and a second part disposed on the pad area and the second conductive line includes a first part disposed on the pixel area and a second part disposed on the pad area. The first part of the first conductive line and the first part of the second conductive line are parallel to each other and the second part of the first conductive line and the second part of the second conductive line are overlapped vertically.

18 Claims, 6 Drawing Sheets

DISPLAY PANEL AND DISPLAY DEVICE INCLUDING THE SAME

CROSS-REFERENCE TO RELATED APPLICATIONS

This U.S. non-provisional patent application claims priority under 35 U.S.C. § 119 of Korean Patent Application Nos. 10-2015-0181839, filed on Dec. 18, 2015, and 10-2016-0081975, filed on Jun. 29, 2016, the entire contents of which are hereby incorporated by reference.

BACKGROUND

The present disclosure herein relates to a display panel and a display device including the same, and more particularly, to a Chip On Glass (COG) type display panel and a display device including the same.

The inventive concept relates to a liquid crystal display device, and more particularly, to a pattern formation of an input/output signal transmission pad in a COG mounting structure liquid crystal display device.

With the recent rapid development to information society, the need for flat panel display devices having excellent characteristics such as thin thickness, light weight, and low power consumption emerges, and since a liquid crystal display among them has excellent resolution, color display, and image quality, it is actively applied to a monitor of a notebook computer or a desktop computer.

In general, a liquid crystal display device is a device where two substrates with respective electrodes are disposed to allow surfaces with the two electrodes to face each other, and after a liquid crystal material is injected between the two substrates, liquid crystal molecules are moved by an electric field generated by applying voltage to the two electrodes in order to represent an image by a light transmittance changed according thereto.

Such a liquid crystal display device includes a liquid crystal panel where liquid crystal is injected between two substrates, a backlight disposed at a lower part of the liquid crystal panel and used as a light source, and a driving unit disposed at the outside of the liquid crystal panel and configured to drive the liquid crystal panel.

Herein, the driving unit includes a drive integrated circuit (IC) for applying signals to wires of the liquid crystal panel, and according to a method of packaging the drive IC in the liquid crystal panel, there are chip on glass (COG), tape carrier package (TCP), and chip on file (COF).

A COG method among them is a method for directly adhering a driving IC to an array substrate of a liquid crystal display device in order to directly connect an output electrode of the drive IC to a wire pad on the array substrate. Thus, the COG method has a simple structure so that manufacturing processes are simple and manufacturing costs are less.

SUMMARY

The present disclosure provides a display panel having a minimized area that a pad occupies and a display device including the same.

An embodiment of the inventive concept provides a display panel including: a substrate including a pixel area and a pad area; and a first conductive line and a second conductive line stacked on the substrate, wherein the first conductive line includes a first part disposed on the pixel area and a second part disposed on the pad area and the second conductive line includes a first part disposed on the pixel area and a second part disposed on the pad area, wherein the first part of the first conductive line and the first part of the second conductive line are parallel to each other; and the second part of the first conductive line and the second part of the second conductive line are overlapped vertically.

In an embodiment, a length of the second part of the first conductive line may be different from a length of the second part of the second conductive line.

In an embodiment, a length of the second part of the second conductive line may be shorter than a length of the second part of the first conductive line.

In an embodiment, the display panel may further include: a first pad disposed on an end part of the second part of the first conductive line and electrically connected to the first conductive line; and a second pad disposed on an end part of the second part of the second conductive line and electrically connected to the second conductive line, wherein the first pad and the second pad may be arranged in a line.

In an embodiment, the first conductive line may further include a third part disposed on the pad area and disposed between the first part and the second part; the second conductive line may further include a third part disposed on the pad area of the substrate and disposed between the first part and the second part; and the third part of the first conductive line and the third part of the second conductive line may not be overlapped vertically.

In an embodiment of the inventive concept, a display panel includes: a substrate including a pixel area and a pad area; a first conductive line and a second conductive line stacked on the pixel area of the substrate and extending in one direction on the pad area; a first pad disposed on the pad area of the substrate and disposed on an end part of the first conductive line; and a second pad disposed on the pad area of the substrate and disposed on an end part of the second conductive line, wherein the first pad and the second pad are arranged along the one direction.

In an embodiment, the first conductive line may include a first part disposed on the pad area; the second conductive line may include a second part disposed on the pad area; and the first part of the first conductive line and the second part of the second conductive line may be overlapped vertically.

In an embodiment, a length of the first part of the first conductive line may be different from a length of the second part of the second conductive line.

In an embodiment, the display panel may further include: a third conductive line disposed on the pixel area of the substrate and extending in the one direction on the pad area, wherein the third conductive line may include a third part disposed on the pad area; and a third pad disposed on the pad area and disposed on an end part of the third part of the third conductive line, wherein the third part of the third conductive line may not be overlapped vertical to the first part of the first conductive line and the second part of the second conductive line, and the third pad may be arranged in the one direction along the first pad and the second pad.

In an embodiment, an upper surface of the first pad may be disposed in a different level than an upper surface of the second pad.

In an embodiment, the upper surface of the first pad may be disposed in a lower level than the upper surface of the second pad.

In an embodiment, a thickness of the first pad may be identical to a thickness of the second pad.

In an embodiment, a thickness of the first pad may be different from a thickness of the second pad.

In an embodiment, a thickness of the first pad may be thicker than a thickness of the second pad.

In an embodiment of the inventive concept, a display device includes: a display panel including a substrate including a pixel area and pad area, a first conductive line and a second conductive line stacked on the substrate, and a first pad disposed on the pad area of the substrate and electrically connected to the first conductive line and a second pad disposed on the pad area of the substrate and electrically connected to the second conductive line; and a driving circuit mounted on the pad area of the substrate and electrically connected to the first conductive line and the second conductive line, wherein the first pad and the second pad are arranged in a line.

In an embodiment, the first conductive line may include a first part disposed on the pad area of the substrate; the second conductive line may include a second part disposed on the pad area of the substrate; and the first part may be overlapped vertical to the second part.

In an embodiment, the first conductive line may include a first part disposed on the pad area of the substrate; the second conductive line may include a second part disposed on the pad area of the substrate; and the first part may not be overlapped vertical to the second part.

In an embodiment, the display device may further include: a first bump disposed on one surface of the driving circuit and contacting the first pad; and a second bump disposed on the one surface of the driving circuit and contacting the second pad.

In an embodiment, a maximum thickness of the first bump may be thicker than a maximum thickness of the second bump.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numbers refer to like elements throughout the entire specification.

The terms used in this specification are used only for explaining specific embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, embodiments described in this specification will be described with plan views sectional views, that is, ideal exemplary views of the inventive concept. In the drawings, the thicknesses of a layer and an area are exaggerated for effective description. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the inventive concept.

Figure 1:
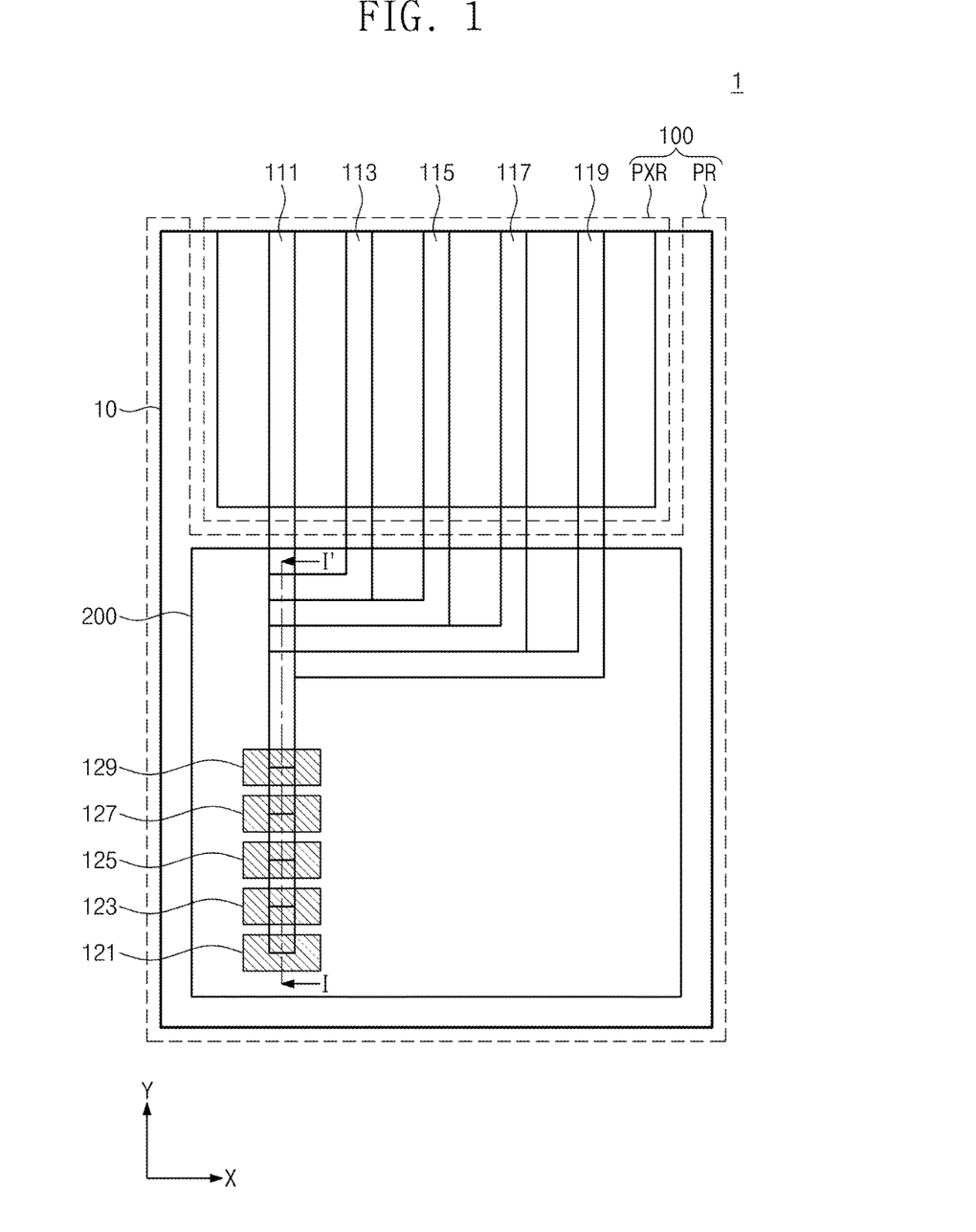
FIG. 1 is a plan view illustrating a part of a display device including a display panel according to an embodiment of the inventive concept.
Figure 2:
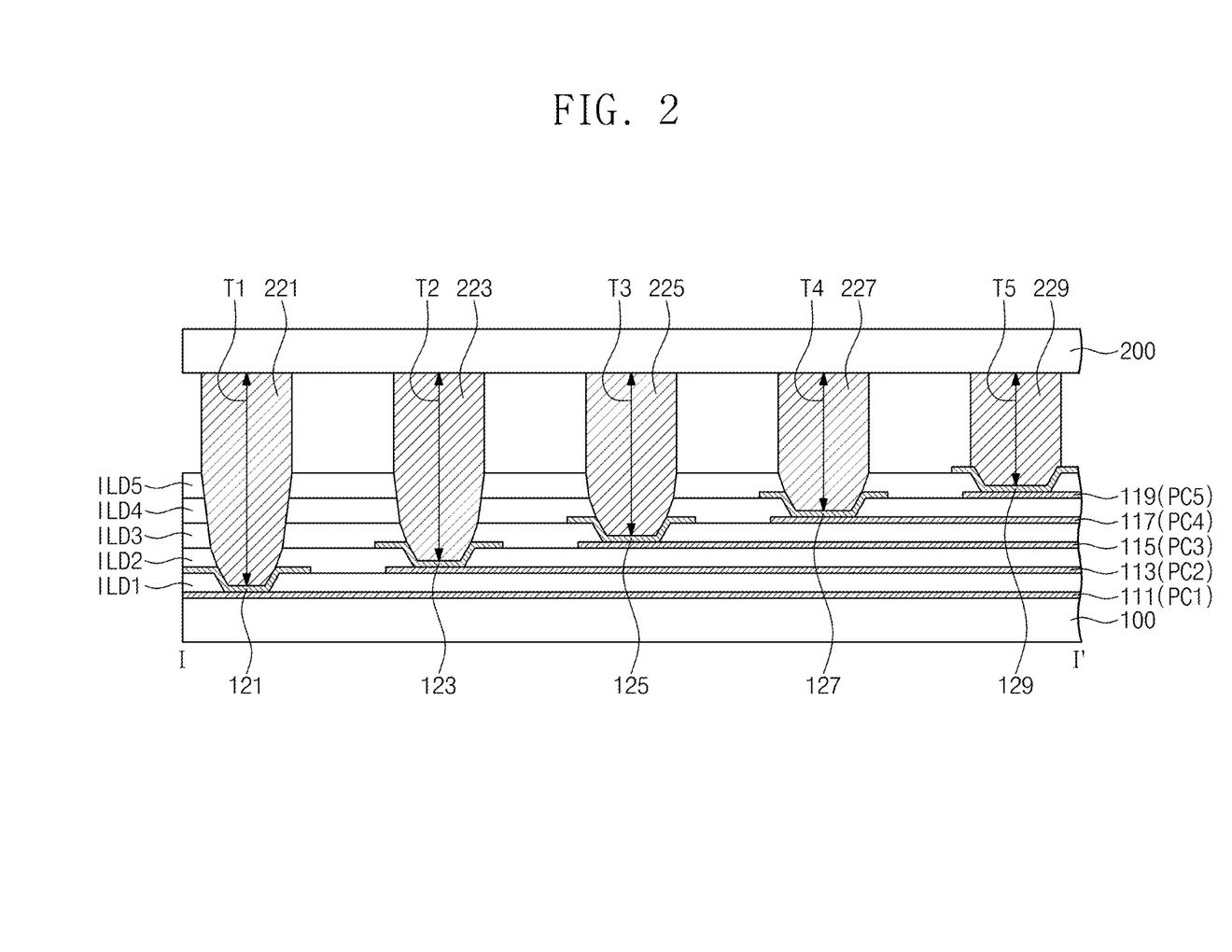
FIG. 2 is a sectional view taken along a line I-I' of FIG. 1, which illustrates a display device including a display panel according to an embodiment of the inventive concept.
Figure 3:
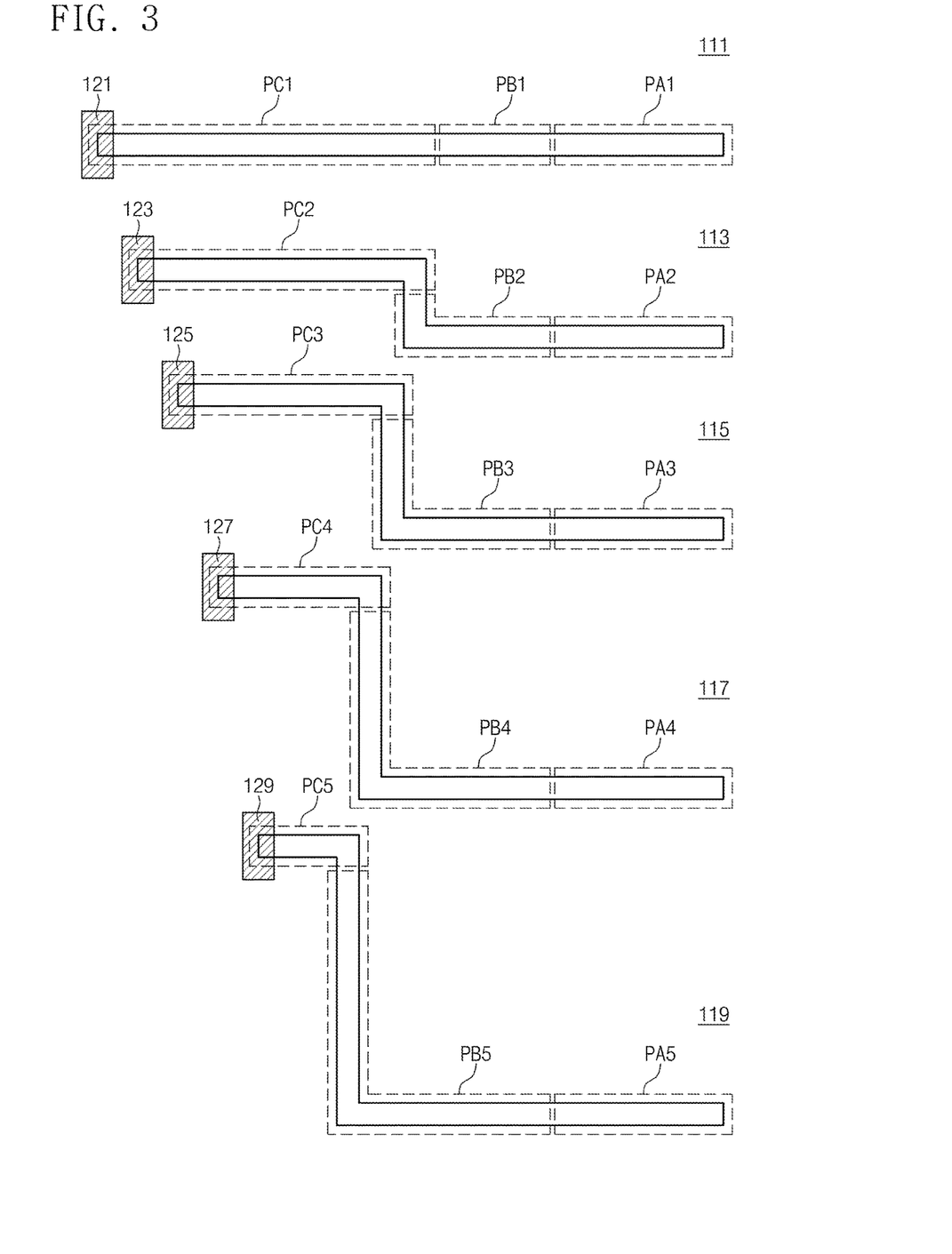
FIG. 3 is a plan view illustrating first to fifth conductive lines shown in FIG. 1.

FIG. 1 is a plan view illustrating a part of a display device including a display panel according to an embodiment of the inventive concept. FIG. 2 is a sectional view taken along a line I-I' of FIG. 1. FIG. 3 is a plan view illustrating first to fifth conductive lines shown in FIG. 2.

Referring to FIGS. 1 and 2, a display device 1 may include a display panel 10 and a driving circuit 200 mounted on the display panel 10. The display panel 10 may include a substrate 100, conductive lines 111, 113, 115, 117, and 119, and pads 121, 123, 125, 127, and 129.

The substrate 100 may include a pixel area PXR and a pad area PR around the pixel area PXR. The substrate 100 may be a glass substrate or a plastic substrate including Polyethylen terephthalate (PET), Polyethylen naphthalate (PEN), or Polyimide.

A first conductive line 111, a second conductive line 113, a third conductive line 115, a fourth conductive line 117, and a fifth conductive line 119 may be sequentially stacked on the substrate 100. The first conductive line 111 may be electrically connected to a first lower capacitor electrode (not shown). The second conductive line 113 may be disposed on the first conductive line 111. The second conductive line 113 may be electrically connected to an upper capacitor electrode (not shown). The third conductive line 115 may be disposed on the second conductive line 113. For example, the third conductive line 115 may correspond to a gate line or a data line. When the third conductive line 115 corresponds to a gate line, it may contact a gate electrode (not shown) of a thin film transistor for switching a pixel. When the third conductive line 115 corresponds to a data line, it may contact a source electrode (not shown) and a drain electrode (not shown) of a thin film transistor. The fourth conductive line 117 may be electrically connected to the third conductive line 115 in the pixel area PXR of the substrate 100. For example, the fourth conductive line 117 may correspond to a light blocking line for blocking light to a thin film transistor. The fifth conductive line 119 may be electrically connected to the fourth conductive line 115 in the pixel area PXR of the substrate 100. For example, the fifth conductive line 119 may correspond to a reflective line for reflecting light provided to a panel.

The first to fifth conductive lines 111, 113, 115, 117, and 119, for example, may include at least one of Al, Pt, Pd, Ag, Mg, Au, Ni, Nd, Ir, Cr, Ni, Mo, Ti, W, and Cu.

From the plan view, the first to fifth conductive lines 111, 113, 115, 117, and 119 may be arranged in a first direction X and extend in a second direction Y intersecting the first direction X. The first conductive line 111 may include first to third parts PA1, PB1, and PC1. The second conductive line 113 may include first to third parts PA2, PB2, and PC2. The third conductive line 115 may include first to third parts PA3, PB3, and PC3. The fourth conductive line 117 may include first to third parts PA4, PB4, and PC4. Then, the fifth conductive line 119 may include first to third parts PA5, PB5, and PC5.

The first parts PA1, PA2, PA3, PA4, and PA5 of the first to fifth conductive lines 111, 113, 115, 117, and 119 may be disposed on the pixel area PXR of the substrate 100. The first parts PA1, PA2, PA3, PA4, and PA5 of the first to fifth conductive lines 111, 113, 115, 117, and 119 may be parallel to each other. The second parts PB1, PB2, PB3, PB4, and PB5 and the third parts PC1, PC2, PC3, PC4, and PC5 of the first to fifth conductive lines 111, 113, 115, 117, and 119 may be disposed on the pad area PR of the substrate 100.

In more detail, referring to FIGS. 1 and 3, the second part PB1 of the first conductive line 111 may be disposed between the first part PA1 and the third part PC1 of the first conductive line 111. The second part PB2 of the second conductive line 113 may be disposed between the first part PA2 and the third part PC2 of the second conductive line 113. The second part PB3 of the third conductive line 115 may be disposed between the first part PA3 and the third part PC3 of the third conductive line 115. The second part PB4 of the fourth conductive line 117 may be disposed between the first part PA4 and the third part PC4 of the fourth conductive line 117. Then, the second part PB5 of the fifth conductive line 119 may be disposed between the first part PA5 and the third part PC5 of the fifth conductive line 119.

From the plan view, the second parts PB1, PB2, PB3, PB4, and PB5 of the first to fifth conductive lines 111, 113, 115, 117, and 119 may not be overlapped vertical to each other, and the third parts PC1, PC2, PC3, PC4, and PC5 of the first to fifth conductive lines 111, 113, 115, 117, and 119 may be overlapped vertical to each other.

The third parts PC1, PC2, PC3, PC4, and PC5 of the first to fifth conductive lines 111, 113, 115, 117, and 119 may have different lengths. As shown in FIG. 2, the lengths of the third parts PC1, PC2, PC3, PC4, and PC5 of the first to fifth conductive lines 111, 113, 115, 117, and 119 may become shorter as they are progressively away from the upper surface of the substrate 100.

In more detail, the third part PC2 of the second conductive line 113 may be shorter than the third part PC1 of the first conductive line 111, the third part PC3 of the third conductive line 115 may be shorter than the third part PC2 of the second conductive line 113, the third part PC4 of the fourth conductive line 117 may be shorter than the third part PC3 of the third conductive line 115, and the third part PC5 of the fifth conductive line 119 may be shorter than the third part PC4 of the fourth conductive line 117.

The pads 121, 123, 125, 127, and 129 may be disposed on one end parts of the first to fifth conductive lines 111, 113, 115, 117, and 119. In more detail, the first pad 121 electrically connected to the first conductive line 111 may be disposed on one end part of the third part PC1 of the first conductive line 111 and the second pad 123 electrically connected to the second conducive line 113 may be disposed on one end part of the third part PC2 of the second conductive line 113. The third pad 125 electrically connected to the third conductive line 115 may be disposed on one end part of the third part PC3 of the third conductive line 115 and the fourth pad 127 electrically connected to the fourth conducive line 117 may be disposed on one end part of the third part PC4 of the fourth conductive line 117. Then, the fifth pad 129 electrically connected to the fifth conductive line 119 may be disposed on one end part of the third part PC5 of the fifth conductive line 119.

From the plan view, the first to fifth pads 121, 123, 125, 127, and 129 may be arranged along the second direction Y. For example, from the plan view, the first to fifth pads 121, 123, 125, 127, and 129 may be arranged in a line on the third part PC1 of the first conductive line 111.

Upper surfaces of the first to fifth pads 121, 123, 125, 127, and 129 that directly contact first to fifth bumps 221, 223, 225, 227, and 229 may be disposed in different levels. In more detail, the upper surface of the first pad 121 may be disposed lower than the upper surface of the second pad 123, the upper surface of the second pad 123 may be disposed lower than the upper surface of the third pad 125, the upper surface of the third pad 125 may be disposed lower than the upper surface of the fourth pad 127, and the upper surface of the fourth pad 127 may be disposed lower than the upper surface of the fifth pad 129. In one example, the thicknesses of the first to fifth pads 121, 123, 125, 127, and 129 may be identical to each other.

The first to fifth pads 121, 123, 125, 127, and 129 may include a metallic material (for example, Cu).

In one example, a plurality of conductive lines is disposed to be overlapped vertical to each other on the pad area PR of the substrate 100, so that pads may be disposed in a line on the respective one end parts of the conductive lines. Accordingly, a larger number of pads may be disposed in a limited area.

A first interlayer insulation layer ILD1 may be disposed between the first conductive line 111 and the second conductive line 113. The first interlayer insulation layer ILD1 may cover an upper surface of the first conductive line 111 and expose the upper surface of the first pad 121. A second interlayer insulation layer ILD2 may be disposed between the second conductive line 113 and the third conductive line 115. The second interlayer insulation layer ILD2 may cover an upper surface of the second conductive line 113 and a part of an upper surface of the first interlayer insulation layer ILD1 and expose the upper surface of the second pad 123. A third interlayer insulation layer ILD3 may be disposed between the third conductive line 115 and the fourth conductive line 117. The third interlayer insulation layer ILD3 may cover an upper surface of the third conductive line 115 and a part of an upper surface of the second interlayer insulation layer ILD2 and expose the upper surface of the third pad 125. A fourth interlayer insulation layer ILD4 may be disposed between the fourth conductive line 117 and the fifth conductive line 119. The fourth interlayer insulation layer ILD4 may cover an upper surface of the fourth conductive line 117 and a part of an upper surface of the third interlayer insulation layer ILD3 and expose the upper surface of the fourth pad 127. Then, a fifth interlayer insulation layer ILD5 may be disposed on the fifth conductive line 119 in order to cover an upper surface of the fifth conductive line 119 and a part of an upper surface of the fourth interlayer insulation layer ILD4. The fifth interlayer insulation layer ILD5 may expose the upper surface of the fifth pad 129.

The first to fifth interlayer insulation layers ILD1, ILD2, ILD3, ILD4, and ILD5, for example, may include a silicon oxide layer or a silicon nitride layer.

The driving circuit 200 may be disposed on the pad area PR of the substrate 100. The first to fifth bumps 221, 223, 225, 227, and 229 disposed one surface of the driving circuit 200 may be disposed in correspondence to the first to fifth pads 121, 123, 125, 127, and 129. In more detail, the first bump 221 may contact the upper surface of the first pad 121 and the second bump 223 may contact the upper surface of the second pad 123. The third bump 225 may contact the upper surface of the third pad 125, the fourth bump 227 may contact the upper surface of the fourth pad 127, and the fifth bump 229 may contact the upper surface of the fifth pad 129.

One surfaces of the first to fifth bumps 221, 223, 225, 227, and 229 contacting one surface of the driving circuit 200 may be disposed in the same level, and other surfaces of the first to fifth bumps 221, 223, 225, 227, and 229 facing the one surfaces of the first to fifth bumps 221, 223, 225, 227, and 229 may be disposed in different levels.

In one example, the first to fifth bumps 221, 223, 225, 227, and 229 may have different thicknesses. In more detail, the maximum thickness T1 of the first bump 221 may be thicker than the maximum thickness T2 of the second bump 223, and the maximum thickness T2 of the second bump 223 may be thicker than the maximum thickness T3 of the third bump 225. Then, the maximum thickness T3 of the third bump 225 may be thicker than the maximum thickness T4 of the fourth bump 227, and the maximum thickness T4 of the fourth bump 227 may be thicker than the maximum thickness T5 of the fifth bump 229.

The first to fifth bumps 221, 223, 225, 227, and 229 may include a metallic material (for example, In, Sn, and Pb).

Figure 4:
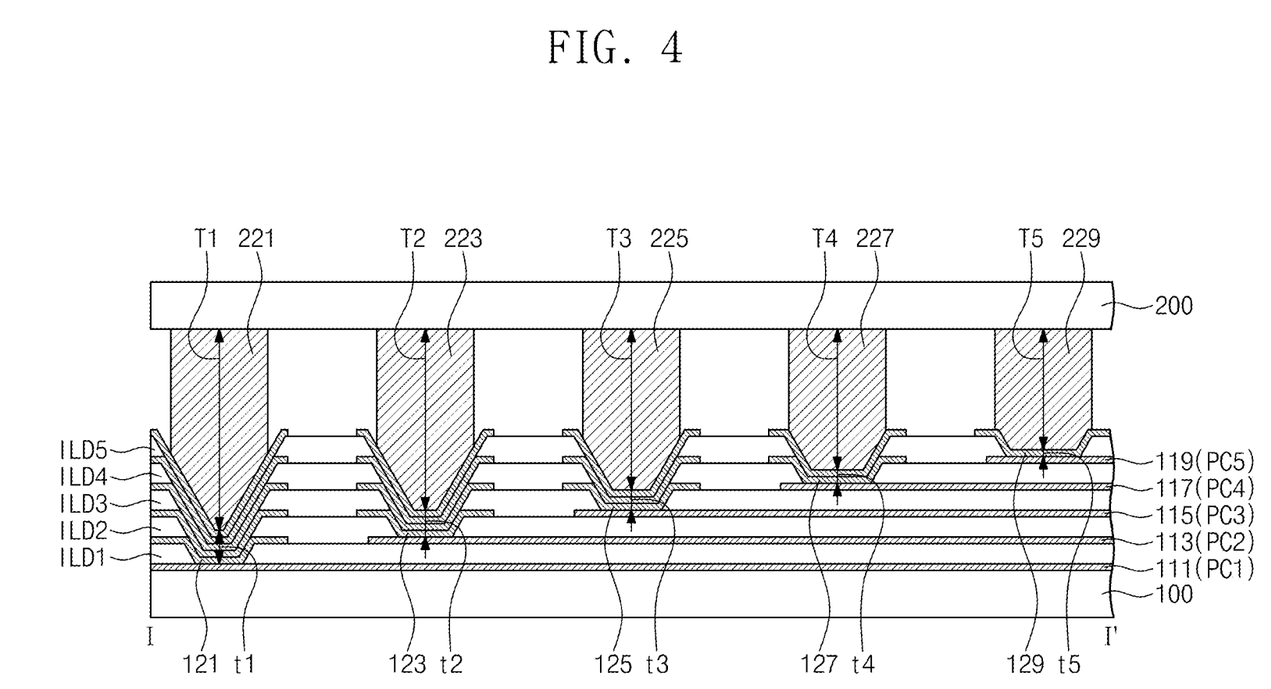
FIG. 4 is a sectional view taken along a line I-I' of FIG. 1 according to embodiments of the inventive concept.

FIG. 4 is a sectional view taken along a line I-I' of FIG. 1 according to embodiments of the inventive concept. For concise description, like reference numerals refer to like components in a display device including the display panel described with reference to FIGS. 1 to 3, and overlapping descriptions are omitted.

Referring to FIG. 4, the thicknesses of the first to fifth pads 121, 123, 125, 127, and 129 may be different from each other. For example, a thickness t1 of the first pad 121 may be thicker than a thickness t2 of the second pad 123, a thickness t2 of the second pad 123 may be thicker than a thickness t3 of the third pad 125, a thickness t3 of the third pad 125 may be thicker than a thickness t4 of the fourth pad 127, and a thickness t4 of the fourth pad 127 may be thicker than a thickness t5 of the fifth pad 129.

In more detail, the first pad 121 may include five conductive layers that are sequentially stacked on the first conductive line 111. The second pad 123 may include four conductive layers that are sequentially stacked on the second conductive line 113. The third pad 125 may include three conductive layers that are sequentially stacked on the third conductive line 115. The fourth pad 127 may include two conductive layers that are sequentially stacked on the fourth conductive line 117. Then, the fifth pad 129 may include a single conductive layer.

Figure 5:
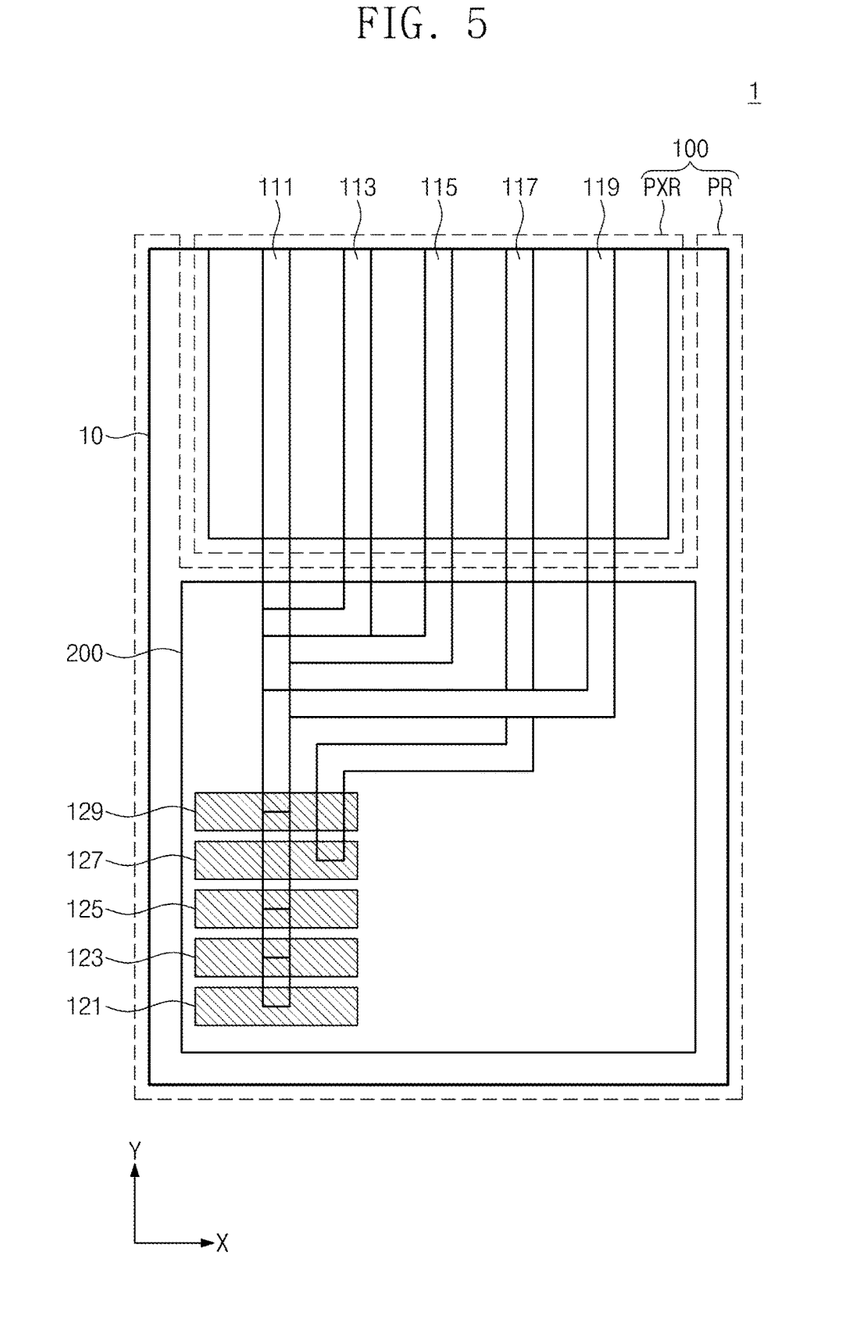
FIG. 5 is a plan view illustrating a part of a display device including a display panel according to an embodiment of the inventive concept.
Figure 6:
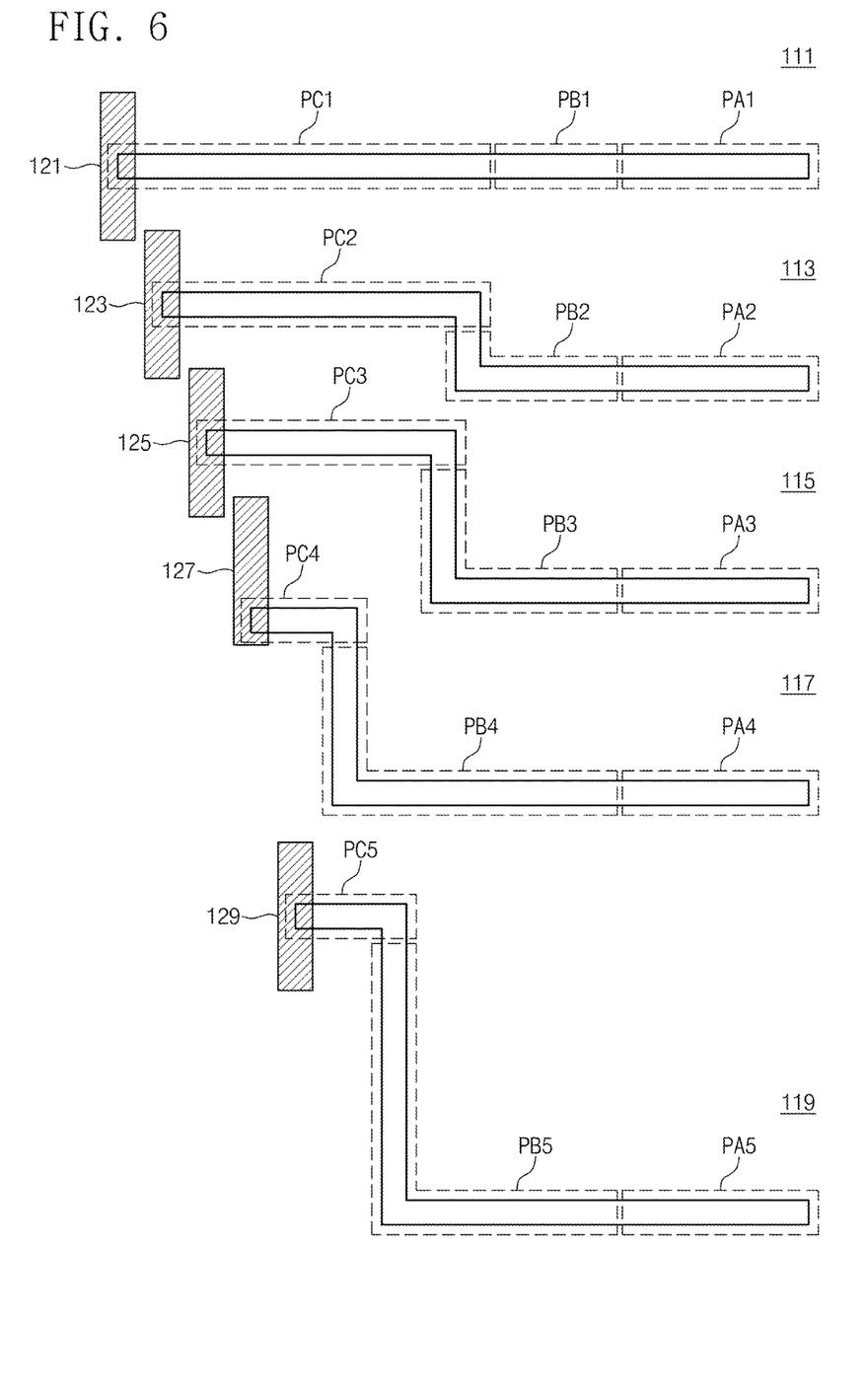
FIG. 6 is a plan view illustrating first to fifth conductive lines shown in FIG. 5.

FIG. 5 is a plan view illustrating a part of a display device including a display panel according to an embodiment of the inventive concept. FIG. 6 is a plan view illustrating first to fifth conductive lines shown in FIG. 5. For concise description, like reference numerals refer to like components in a display device including the display panel described with reference to FIGS. 1 to 3, and overlapping descriptions are omitted.

Referring to FIGS. 5 and 6, from the plan view, the third parts PC1, PC2, and PC3 of the first to third conductive lines 111, 113, and 115 and the third part PC5 of the fifth conductive line 119 may be overlapped vertical to each other. Then, from the plan view, the third part PC4 of the fourth conductive line 117 may not be overlapped vertical to the third parts PC1, PC2, and PC3 of the first to third conductive lines 111, 113, and 115 and the third part PC5 of the fifth conductive line 119. In more detail, from the plan view, the third part PC4 of the fourth conductive line 117 may be spaced in the first direction X away from the third parts PC1, PC2, and PC3 of the first to third conductive lines 111, 113, and 115 and the third part PC5 of the fifth conductive line 119.

The first pad 121 may be disposed on the third part PC1 of the first conductive line 111, the second pad 123 may be disposed on the third part PC2 of the second conductive line 113, the third pad 125 may be disposed on the third part PC3 of the third conductive line 115, the fourth pad 127 may be disposed on the third part PC4 of the fourth conductive line 117, and the fifth pad 129 may be disposed on the third part PC5 of the fifth conductive line 119. From the plan view, the first to fifth pads 121, 123, 125, 127, and 129 may be arranged along the second direction Y. In one example, the first to fifth pads 121, 123, 125, 127, and 129 may be arranged in a line.

In one example, during AC drive, in order to minimize an electrical interference between overlapping conductive lines, at least one (for example, a fourth conductive line) of first to fifth conductive lines may be disposed not to overlap the remaining conductive lines (for example, the first conductive line, the second conductive line, the third conductive line, and the fifth conductive line).

According to an embodiment of the inventive concept, as a plurality of conductive lines are disposed to be overlapped vertical to each other on a pad are of a substrate, so that pads disposed on one end parts of the conductive lines may be arranged in a line. Accordingly, a larger number of pads may be disposed in a limited area.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display panel comprising:
    a substrate comprising a pixel area and a pad area; and
    a first conductive line and a second conductive line stacked on the substrate, wherein the first conductive line comprises a first part disposed on the pixel area and a second part disposed on the pad area and the second conductive line comprises a first part disposed on the pixel area and a second part disposed on the pad area,
    wherein the first part of the first conductive line and the first part of the second conductive line are parallel to each other; and
    the second part of the first conductive line and the second part of the second conductive line are overlapped vertically.

2. The display panel of claim 1, wherein a length of the second part of the first conductive line is different from a length of the second part of the second conductive line.

3. The display panel of claim 2, wherein a length of the second part of the second conductive line is shorter than a length of the second part of the first conductive line.

4. The display panel of claim 1, further comprising:
a first pad disposed on an end part of the second part of the first conductive line and electrically connected to the first conductive line; and
a second pad disposed on an end part of the second part of the second conductive line and electrically connected to the second conductive line,
wherein the first pad and the second pad are arranged in a line.

5. The display panel of claim 1, wherein the first conductive line further comprises a third part disposed on the pad area and disposed between the first part and the second part;
the second conductive line further comprises a third part disposed on the pad area of the substrate and disposed between the first part and the second part; and
the third part of the first conductive line and the third part of the second conductive line are not overlapped vertically.

6. A display panel comprising:
a substrate comprising a pixel area and a pad area;
a first conductive line and a second conductive line stacked on the pixel area of the substrate and extending in one direction on the pad area;
a first pad disposed on the pad area of the substrate and disposed on an end part of the first conductive line; and
a second pad disposed on the pad area of the substrate and disposed on an end part of the second conductive line,
wherein the first pad and the second pad are arranged along the one direction.

7. The display panel of claim 6, wherein
the first conductive line comprises a first part disposed on the pad area;
the second conductive line comprises a second part disposed on the pad area; and
the first part of the first conductive line and the second part of the second conductive line are overlapped vertically.

8. The display panel of claim 7, wherein a length of the first part of the first conductive line is different from a length of the second part of the second conductive line.

9. The display panel of claim 7, further comprising:
a third conductive line disposed on the pixel area of the substrate and extending in the one direction on the pad area, wherein the third conductive line comprises a third part disposed on the pad area; and
a third pad disposed on the pad area and disposed on an end part of the third part of the third conductive line,
wherein the third part of the third conductive line is not overlapped vertical to the first part of the first conductive line and the second part of the second conductive line, and
the third pad is arranged in the one direction along the first pad and the second pad.

10. The display panel of claim 6, wherein an upper surface of the first pad is disposed in a different level than an upper surface of the second pad.

11. The display panel of claim 10, wherein the upper surface of the first pad is disposed in a lower level than the upper surface of the second pad.

12. The display panel of claim 10, wherein a thickness of the first pad is identical to a thickness of the second pad.

13. The display panel of claim 10, wherein a thickness of the first pad is different from a thickness of the second pad.

14. The display panel of claim 10, wherein a thickness of the first pad is thicker than a thickness of the second pad.

15. A display device comprising:
a display panel comprising a substrate including a pixel area and pad area, a first conductive line and a second conductive line stacked on the substrate, and a first pad disposed on the pad area of the substrate and electrically connected to the first conductive line and a second pad disposed on the pad area of the substrate and electrically connected to the second conductive line; and
a driving circuit mounted on the pad area of the substrate and electrically connected to the first conductive line and the second conductive line,
wherein the first pad and the second pad are arranged in a line
wherein the first conductive line comprises a first part disposed on the pad area of the substrate, the second conductive line comprises a second part disposed on the pad area of substrate, and the first part is overlapped vertical to the second part.

16. The display device of claim 15, wherein the first conductive line comprises a first part disposed on the pad area of the substrate;
the second conductive line comprises a second part disposed on the pad area of the substrate; and
the first part is not overlapped vertical to the second part.

17. The display device of claim 15, further comprising:
a first bump disposed on one surface of the driving circuit and contacting the first pad; and
a second bump disposed on the one surface of the driving circuit and contacting the second pad.

18. The display device of claim 17, wherein a maximum thickness of the first bump is thicker than a maximum thickness of the second bump.

* * * * *